United States Patent [19]
Kosuga

[11] Patent Number: 5,126,703
[45] Date of Patent: Jun. 30, 1992

[54] SIGNAL ATTENUATOR

[75] Inventor: Tadashi Kosuga, Kawagoe, Japan

[73] Assignee: Pioneer Electronic Corporation, Tokyo, Japan

[21] Appl. No.: 636,158

[22] Filed: Dec. 31, 1990

[30] Foreign Application Priority Data

Jun. 22, 1990 [JP] Japan .................................. 2-164420
Oct. 12, 1990 [JP] Japan .................................. 2-273735

[51] Int. Cl.⁵ .................................................. H03H 7/25
[52] U.S. Cl. .................................... 333/81 R; 455/249.1
[58] Field of Search ............... 455/131, 234, 248, 249; 333/17.1, 81 R; 330/145, 284; 307/491, 542

[56] References Cited

U.S. PATENT DOCUMENTS

| | | | |
|---|---|---|---|
| 3,534,278 | 10/1970 | Bodtmann | 333/81 R X |
| 4,019,160 | 4/1977 | Kam | 333/81 R |
| 4,378,536 | 3/1983 | Schwaremann | 333/81 R |
| 4,494,076 | 1/1985 | Rinderle | 330/145 X |

Primary Examiner—Paul Gensler
Attorney, Agent, or Firm—Sughrue, Mion, Zinn, Macpeak & Seas

[57] ABSTRACT

A first PIN diode is connected to the input side of a tuner at the front end of an FM receiver, in an AC coupled fashion parallel to the tuner. A correction inductance is connected parallel to the first PIN diode in an AC coupled fashion. The tuner is connected, at its output side, parallel to a series-connected circuit of a correction capacitor and a second PIN didode. The anodes of the first and second PIN diodes are supplied with an automatic gain control (AGC) voltage. When the AGC voltage varies, the resistances of the first and second PIN diodes vary in a manner to adjust the degree to which the correction inductance and the correction capacitor affect the resonance in the tuner.

3 Claims, 4 Drawing Sheets

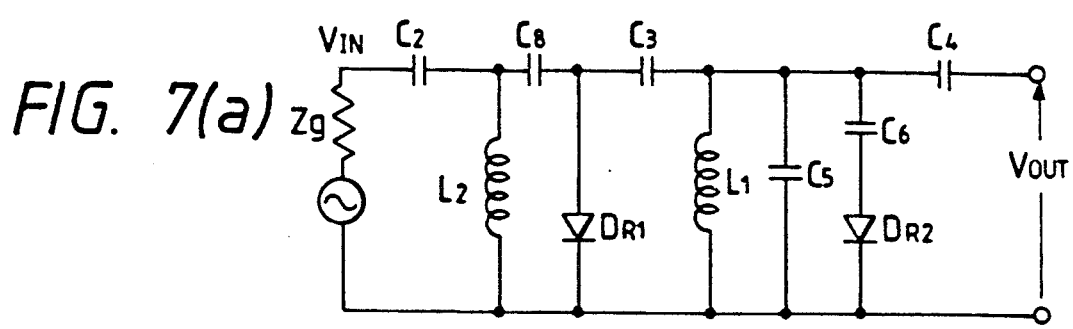
FIG. 7(a)
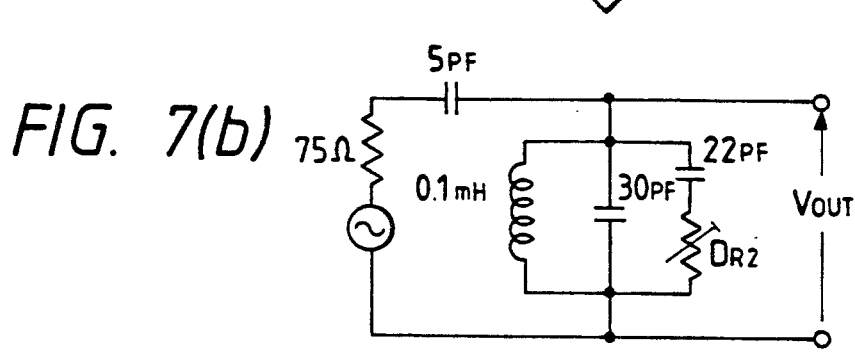
FIG. 7(b)
FIG. 8
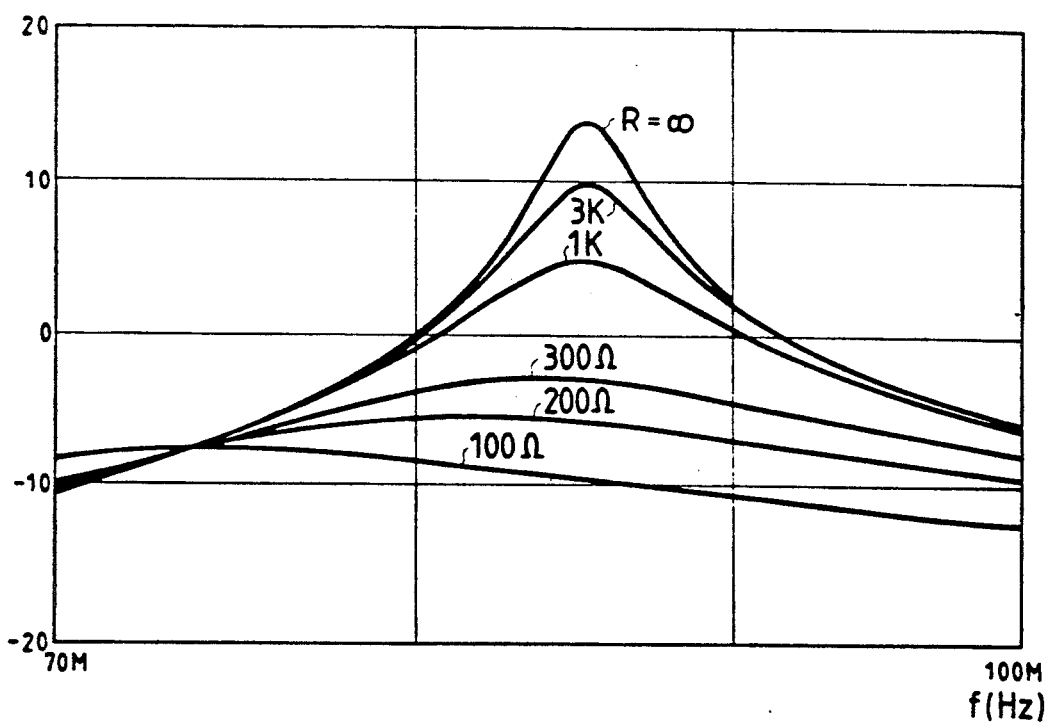

SIGNAL ATTENUATOR

BACKGROUND OF THE INVENTION

The present invention relates to a signal attenuator for use in the front end of an FM tuner circuit, and more particularly to a radio-frequency signal attenuator suitable for use in an automatic gain control (AGC) circuit.

Radio waves transmitted from FM (frequency modulation) broadcast stations are received by aerial antennas. The radio waves received by the antennas are of a very weak level ranging from several microvolts [$\mu$V] to several millivolts [mV]. Therefore, it is necessary to amplify the radio-frequency (RF) signal that is received by an FM receiver. In order to amplify an RF signal stably and sufficiently, it is first converted into a lower-frequency signal, i.e., a signal having an intermediate frequency (IF), which is internationally established as 10.7 [MHz]. The portion of an FM receiver which produces an IF signal is referred to as a "front end".

The front end of an FM receiver comprises an RF amplifier connected to the input terminal for amplifying a received RF signal, a local oscillator for generating a frequency (local oscillation frequency) which is necessary to produce an IF signal, and a mixer for mixing the local oscillation frequency and the RF signal thereby to generate an IF signal. There are known various front end designs which greatly govern the performance of FM receivers. According to one arrangement, the front end includes a tuner and an AGC circuit for receiving a desired broadcast RF signal with a good S/N ratio.

The AGC circuit extracts a portion of the IF signal from a front stage of an IF amplifier which is connected to the mixer, and produces, with a diode, a DC voltage that is proportional to the amplitude of the IF signal. Then, the DC voltage (AGC voltage) is fed back to the input stage of the front end, so that the attenuation of the input RF signal applied to the RF amplifier is regulated depending on the magnitude of the received RF signal. A signal attenuator is used to attenuate the input RF signal.

One conventional signal attenuator includes a PIN diode connected between a signal line and a ground line. Since the PIN diode has a variable resistance depending on the forward current flowing therethrough, it causes a variable attenuation of a DC component of the signal flowing through the signal line, depending on the AGC voltage.

The signal attenuator with the PIN diode is however disadvantageous in that the central frequency of the attenuation characteristics thereof tends to vary as the resistance of the PIN diode varies, resulting in a change in the central frequency of the tuner. However, the central frequency of the tuner should be prevented from varying because a change in the central frequency of the tuner would bring about a tracking error when a desired broadcast station is to be selected.

SUMMARY OF THE INVENTION

It is therefore an object of the present invention to provide a signal attenuator which prevents the central frequency of attenuation characteristics thereof from varying when it attenuates a signal.

According to the present invention, there is provided a signal attenuator comprising a tuner composed of an inductance and a capacitor which are connected parallel to each other, a coupling capacitor, a first PIN diode connected to an input side of the tuner through the coupling capacitor, the first PIN diode having an anode, a correction inductance connected parallel to the first PIN diode in an AC coupled fashion, and a series-connected circuit composed of a correction capacitor and a second PIN diode which are connected in series with each other, the series-connected circuit being connected to an output side of the tuner parallel thereto, the second PIN diode having an anode, and means for supplying an automatic gain control voltage to the anodes of the first and second PIN diodes.

As the resistance of the first PIN diode is lowered, the coupling capacitor is virtually connected parallel to the tuner. Since the correction inductance is connected parallel to the first PIN diode, however, the central frequency of the tuner is prevented from being lowered. Specifically, the correction inductance acts to increase the central frequency of the tuner, thereby canceling out a reduction in the central frequency which is caused by the coupling capacitor. The correction inductance does not cope with every level of the input signal and requires fine adjustments because the correction inductance has a constant value. Therefore, the output side of the tuner is connected to the series-connected circuit of the correction capacitor for draining AC energy to ground and the second PIN diode. The resistance of the second PIN diode varies depending on the automatic gain control voltage to slightly vary the degree to which the correction capacitor affects the tuner, i.e., increases the central frequency thereof. In this manner, the central frequency of the tuner is thus prevented from varying.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 5b is a circuit diagram of a circuit modified from the circuit shown in FIG. 5a;

FIG. 7a is a circuit diagram of a circuit which is equivalent to the signal attenuator shown in FIG. 4;

FIG. 7b is a circuit diagram of a circuit modified from the circuit shown in FIG. 7a; and FIG. 8 is a diagram showing the frequency characteristics of the circuit shown in FIG. 7b.

DETAILED DESCRIPTION OF THE INVENTION

Prior to describing a preferred embodiment of the present invention, a general signal attenuator will first be described below for a better understanding of the present invention.

Figure 1:
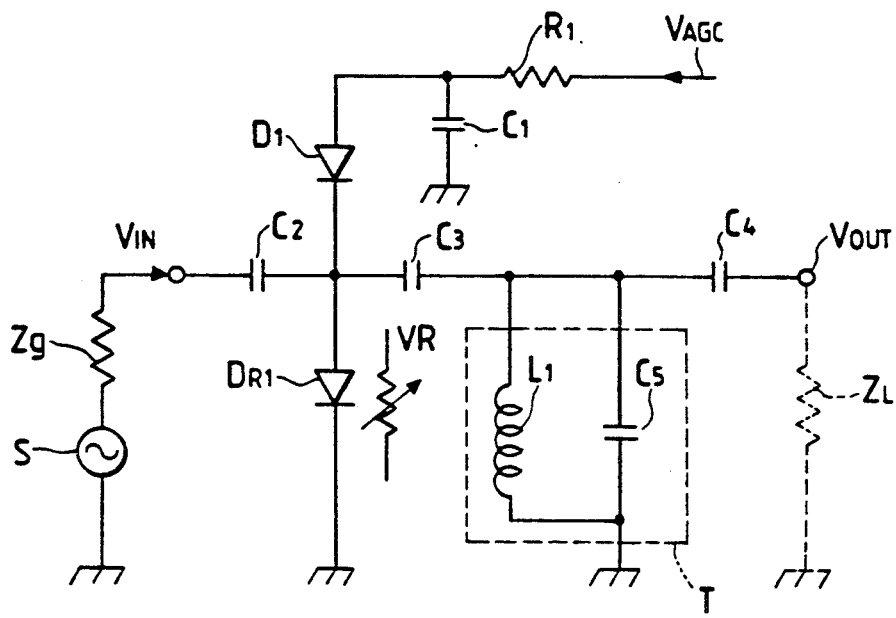
FIG. 1 is a circuit diagram of a conventional signal attenuator.

FIG. 1 shows a general signal attenuator for use in an automatic gain control (AGC) in the front end of an FM receiver. An input signal $V_{IN}$ from an input signal source S such as an antenna or the like is transmitted through a signal source impedance $Z_g$ and applied to a tuner T through two coupling capacitors $C_2$, $C_3$. The tuner T comprises an inductance $L_1$ and a capacitor $C_5$ which are connected parallel to each other. Then, the signal selected by the tuner T is transmitted as an output signal $V_{OUT}$ through a coupling capacitor $C_4$ and supplied to a load impedance $Z_L$. A first PIN diode $D_{R1}$ is connected between ground and a signal line interconnecting the capacitors $C_2$, $C_3$. The first PIN diode $D_{R1}$ has an anode to which an AGC voltage $V_{AGC}$ is applied through a resistor $R_1$, a capacitor $C_1$, and a diode $D_1$. The first PIN diode $D_{R1}$ acts as a variable resistor VR having a negative resistance VR which is variable depending on the forward current flowing between its anode and cathode.

As viewed from the input signal source S, the first PIN diode $D_{R1}$ is connected in series with the signal source impedance $Z_g$. The first PIN diode $D_{R1}$ and the signal source impedance $Z_g$ connected in series therewith divide the voltage of the input signal $V_{IN}$, and the divided voltage is applied through the coupling capacitor $C_3$ to the tuner T. Therefore, the attenuation of the signal supplied to the tuner T depends on the resistance VR of the first PIN diode $D_{R1}$. A change in the level of the received signal is reflected by the AGC voltage $V_{AGC}$, which is applied to the diode $D_1$ through the resistor $R_1$ and the capacitor $C_1$ that constitute a first low-pass filter. The operating point of the first PIN diode $D_{R1}$ is thus determined by a DC voltage.

Therefore, the first PIN diode $D_{R1}$ acts to attenuate the level of the input signal $V_{IN}$ from the input signal source S depending on the input signal $V_{IN}$.

Figure 2:
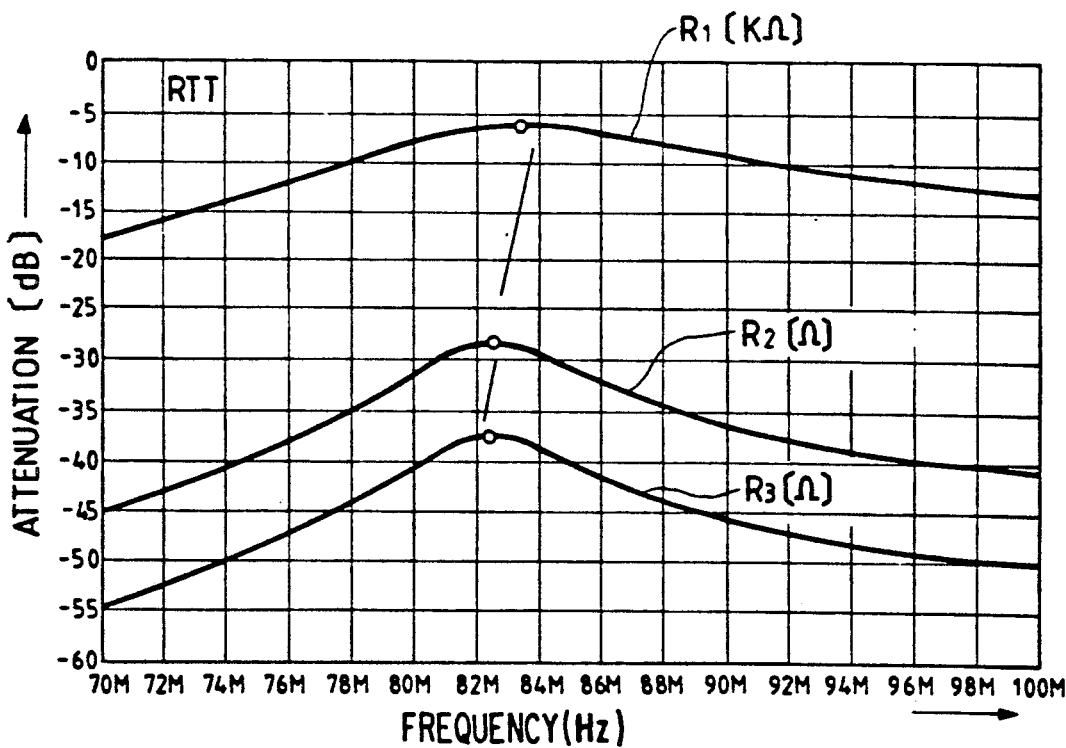
FIG. 2 is a diagram showing the attenuation characteristics of the signal attenuator shown in FIG. 1.

The signal attenuator shown in FIG. 1 has attenuation characteristics as shown in FIG. 2. The characteristic curves shown in FIG. 2 are plotted when the resistance VR is $VR = R_1 [k\Omega]$, $R_2 [k\Omega]$, and $R_3 [k\Omega]$, respectively. As shown in FIG. 2, as the resistance VR varies, the peak of the total impedance is shifted toward lower values, and hence the central frequency of the tuner T is shifted for the following reason: When the resistance VR of the first PIN diode $D_{R1}$ is lowered, the potential at the input side of the coupling capacitor $C_3$ approaches the ground level in a cyclically varying manner (at a radio frequency). The capacitor $C_3$ is thus virtually connected parallel to the tuner T, and hence the number of parallel-connected capacitors of the tuner T is increased, lowering the resonant frequency of the tuner T. If the central frequency of the tuner T varies to a large extent, then a tracking error will be caused when the station of a desired frequency is to be selected.

A signal attenuator according to the present invention will now be described below.

Figure 3:
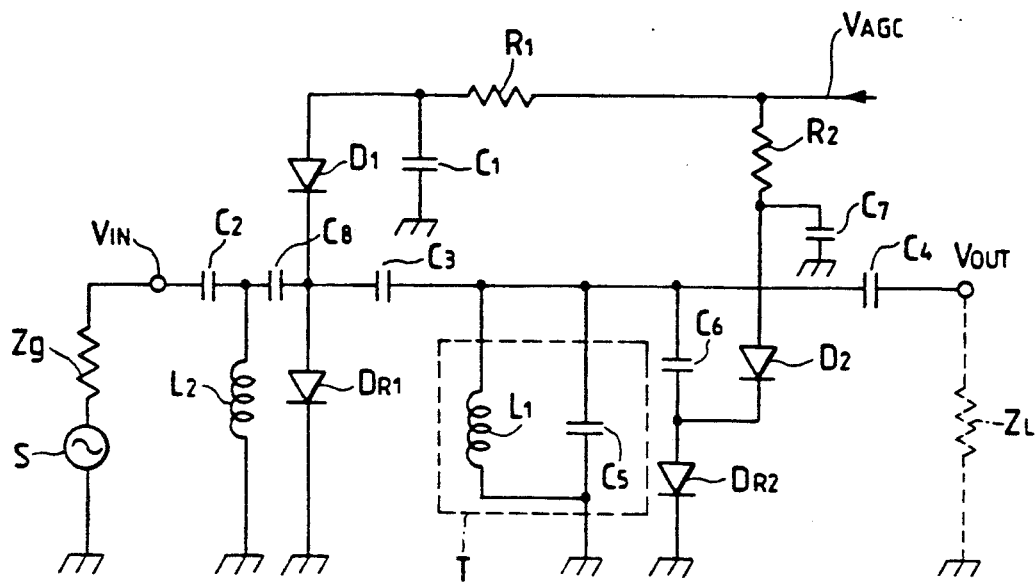
FIG. 3 is a circuit diagram of a signal attenuator according to the present invention.

FIG. 3 shows a signal attenuator according to the present invention. Those parts shown in FIG. 3 which are identical to those shown in FIG. 1 are denoted by identical reference characters. The signal attenuator shown in FIG. 3 differs from the signal attenuator shown in FIG. 1 in that a correction inductance $L_2$ is connected parallel to the first PIN diode $D_{R1}$ through a DC cutoff capacitor $C_8$ in an AC coupled fashion, a series-connected circuit of a correction capacitor $C_6$ and a second PIN diode $D_{R2}$ is connected parallel to the capacitor $C_5$, and the AGC voltage $V_{AGC}$ is also supplied to the junction between the correction capacitor $C_6$ and the second PIN diode $D_{R2}$ through a resistor $R_2$, a capacitor $C_7$, and a diode $D_2$.

The correction capacitor $C_6$ has a relatively small capacitance. The second PIN diode $D_{R2}$ serves as a variable resistor whose resistance depends on the forward current flowing therethrough, as with the first PIN diode $D_{R1}$. The resistor $R_2$ and the capacitor $C_7$ make up a second low-pass filter. The diode $D_2$ applies the AGC voltage $V_{AGC}$ as a bias voltage to the second PIN diode $D_{R2}$.

When the input signal $V_{IN}$ from the input signal source S increases in level, the DC voltage applied to the first PIN diode $D_{R1}$ is also increased, and the resistance VR thereof decreases. At this time, the RF potential at the input side of the coupling capacitor $C_3$, which is determined by the voltage dividing ratio of the signal source impedance $Z_g$ and the resistance VR of the first PIN diode $D_{R1}$, is lowered thereby to attenuate the input signal. When the potential at the input side of the coupling capacitor $C_3$ is lowered to a large extent, it would approach the ground level, virtually connecting the coupling capacitor $C_3$ parallel to the tuner T, whose central frequency would be shifted into a lower range. According to the present invention, the correction inductance $L_2$ connected parallel to the first PIN diode $D_{R1}$ acts to increase the central frequency of the tuner T. As a result, since the correction inductance $L_2$ cancels out a reduction in the central frequency, which is caused by the coupling capacitor $C_3$, the central frequency is prevented from being lowered. The correction inductance $L_2$ has a constant value, and does not cope with every attenuation achieved by the first PIN diode $D_{R1}$. To solve such a problem, the second PIN diode $D_{R2}$, which operates in the same manner as the first PIN diode $D_{R1}$, is employed to adjust the degree to which the correction capacitor $C_6$ contributes to the tuner T. The problem posed by the coupling capacitor $C_3$ is solved by the combination of the correction inductance $L_2$, the correction capacitor $C_6$, and the second PIN diode $D_{R2}$. The signal attenuator shown in FIG. 3 has attenuation characteristics shown in FIG. 4 where the central frequency is substantially prevented from being shifted.

The diodes $D_1$, $D_2$ may comprise switching diodes. Since switching diodes suffer from nonlinear distortion, however, the diodes $D_1$, $D_2$ should preferably comprise PIN diodes. The resistance of the PIN diodes is thus reduced equivalently to ½.

The canceling-out of a reduction in the central frequency will be described below with reference to FIGS. 5a through 8.

Figure 5A:
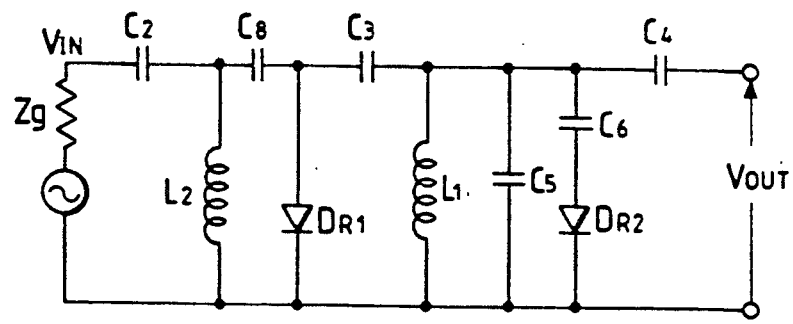
FIG. 5a is a circuit diagram of a circuit which is equivalent to the signal attenuator shown in FIG. 4.
Figure 5B:
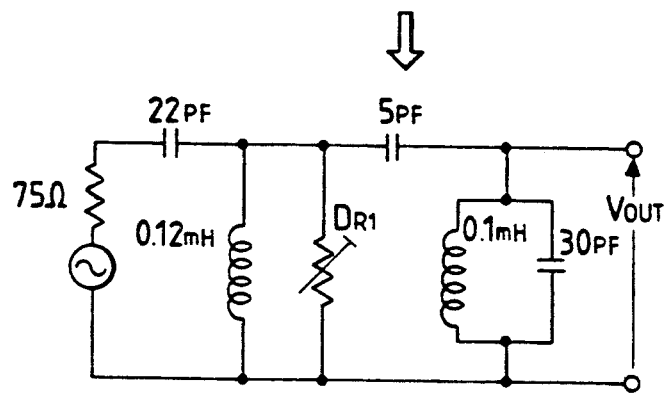
Figure 6:
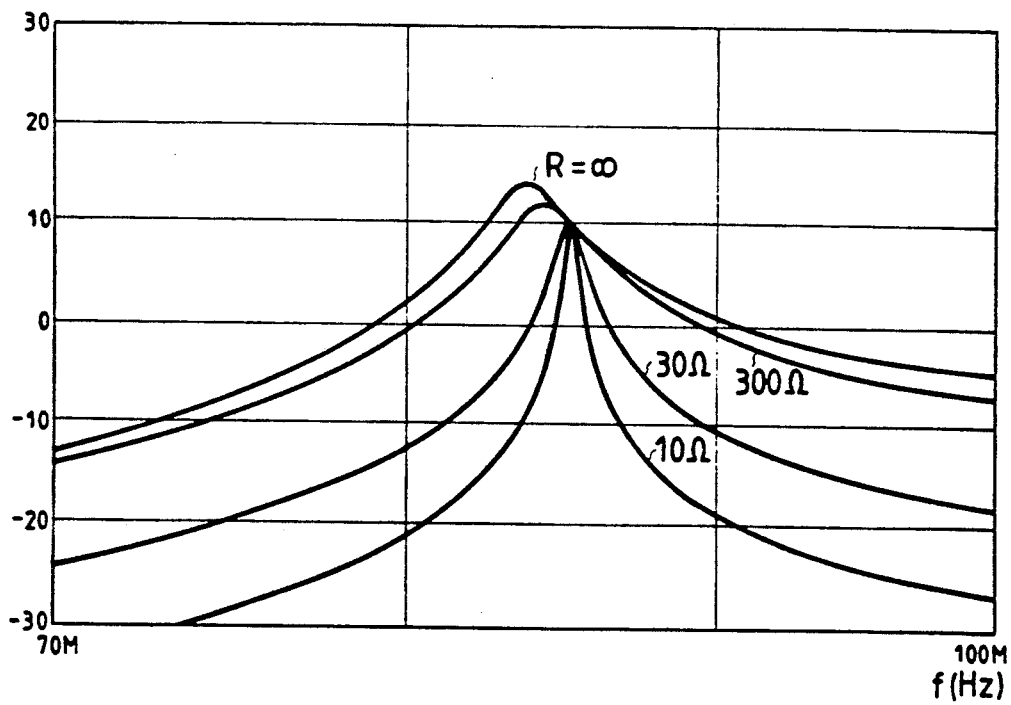
FIG. 6 is a diagram showing the frequency characteristics of the circuit shown in FIG. 5b.

FIG. 5a shows a circuit equivalent to the signal attenuator shown in FIG. 3. FIG. 5b shows a circuit modified from the circuit illustrated in FIG. 5a, with the second PIN diode DR2 omitted. FIG. 6 shows the frequency characteristics of the circuit shown in FIG. 5b, the characteristic curves being plotted with respect to difference resistances VR. Study of FIG. 6 indicates that the central frequency of the tuner is shifted into a lower range when the resistance VR varies from a low value of 10 Ω to a high value of Ω.

FIG. 7b shows another circuit modified from the equivalent circuit shown in FIG. 7a, with the first PIN diode DR1 omitted. FIG. 8 illustrates the frequency characteristics of the circuit shown in FIG. 7b, the characteristic curves being plotted with respect to difference resistances VR. As shown in FIG. 8, the central frequency of the tuner is shifted into a higher range when the resistance VR varies from a low value of 100 Ω to a high value of Ω.

Figure 4:
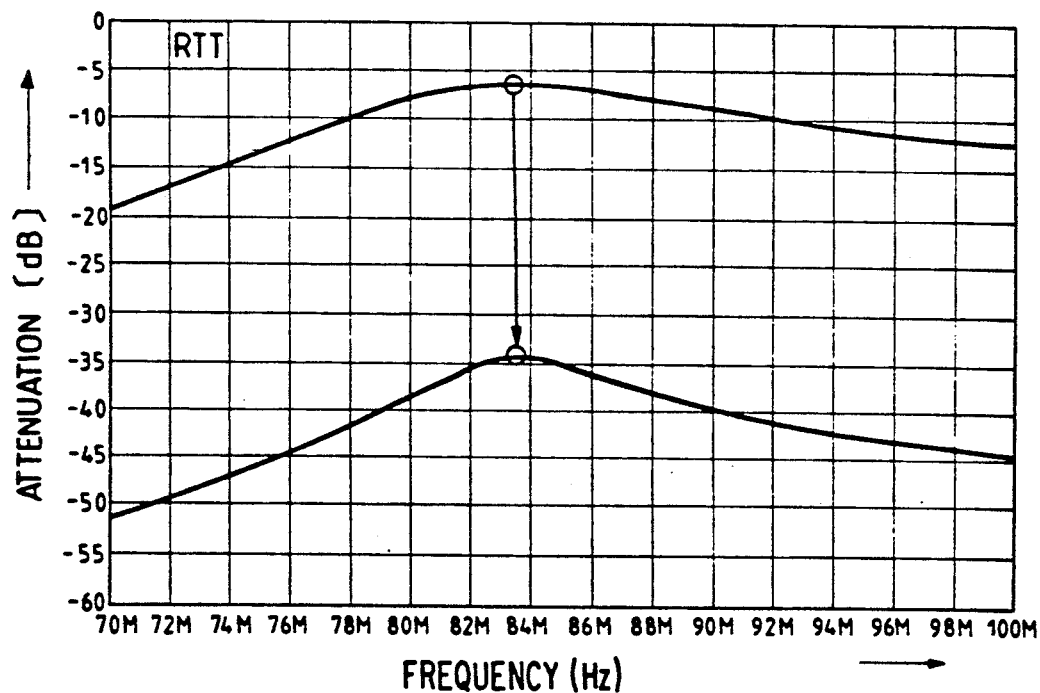
FIG. 4 is a diagram showing the attenuation characteristics of the signal attenuator shown in FIG. 3.

Since the signal attenuator shown in FIG. 3 is a combination of the circuits shown in FIGS. 5b and 7b, the shifts or variations of the central frequencies in the circuits shown in FIGS. 5b and 7b are canceled out by each other in the signal attenuator shown in FIG. 3, and the stable attenuation characteristics shown in FIG. 4 can be achieved.

With the present invention, inasmuch as a change in the central frequency of the tuner is suppressed when the input signal is attenuated, a tracking error with respect to the received frequency is prevented from happening.

Although a certain preferred embodiment has been shown and described, it should be understood that many changes and modifications may be made therein without departing from the scope of the appended claim.

What is claimed is:

1. A signal attenuator comprising:
    a tuner composed of an inductance and a capacitor which are connected parallel to each other;
    a coupling capacitor;
    a first PIN diode connected to an input side of said tuner through said coupling capacitor, said first PIN diode having an anode;
    a correction inductance connected parallel to said first PIN diode in an AC coupled fashion; and
    a series-connected circuit composed of a correction capacitor and a second PIN diode which are connected in series with each other, said series-connected circuit being connected to an output side of said tuner parallel thereto, said second PIN diode having an anode; and
    means for supplying an automatic gain control voltage to the anodes of said first and second PIN diodes.

2. A signal attenuator according to claim 1, wherein said correction inductance is connected to said first PIN diode through a DC cutoff capacitor.

3. A signal attenuator according to claim 1, wherein said means for supplying an automatic gain control voltage comprises:
    a first low pass filter and, further, a first diode provided between said first PIN diode and said first low pass filter,
    and a second low pass filter and, further, a second diode provided between said second PIN diode and said second low pass filter.

* * * * *